Figure 1:
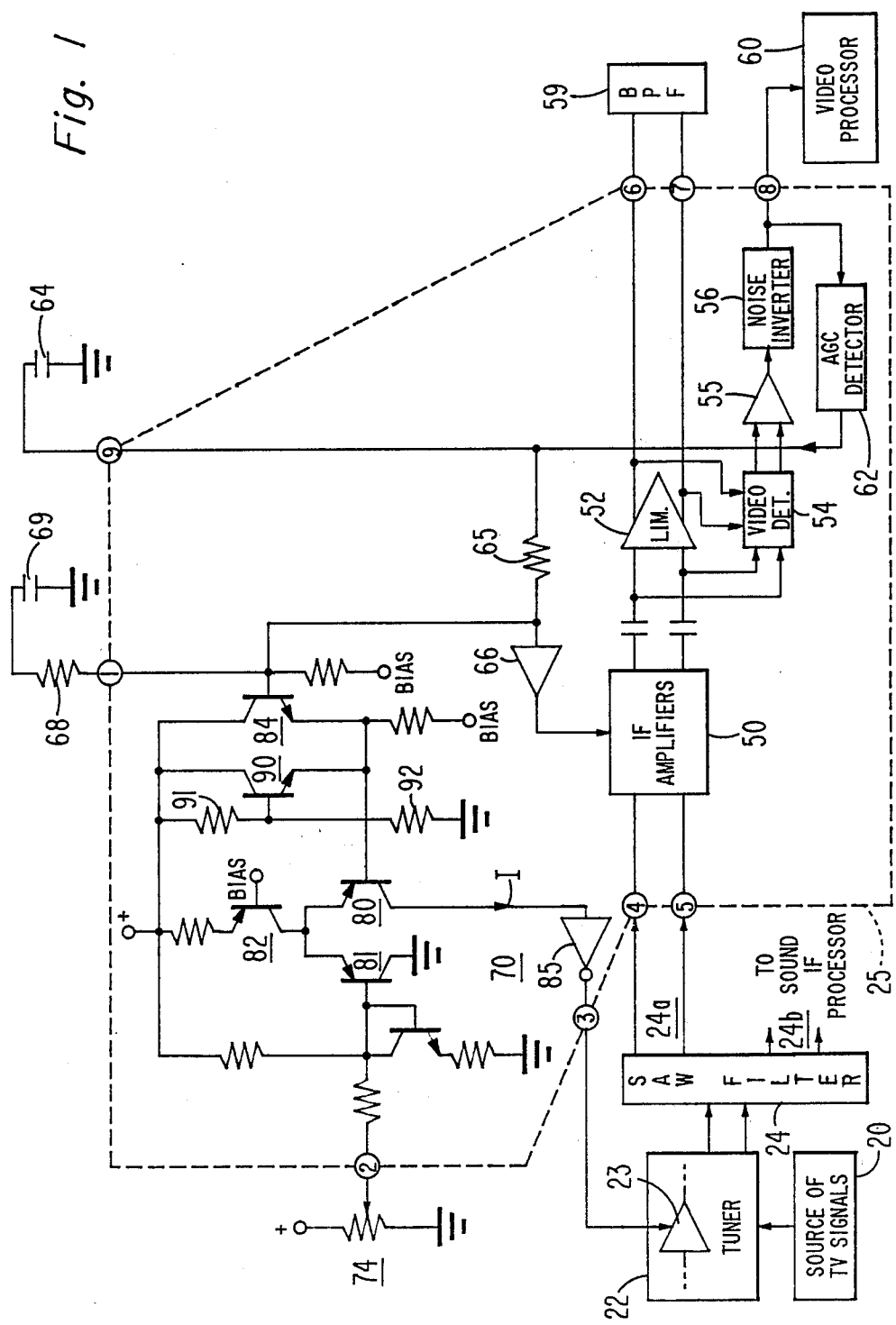

United States Patent [19]

Rumreich

[11] Patent Number: 4,761,687

[45] Date of Patent: Aug. 2, 1988

[54] AUTOMATIC GAIN CONTROL DELAY CIRCUIT FOR A VIDEO SIGNAL PROCESSOR

[75] Inventor: Mark F. Rumreich, Indianapolis, Ind.

[73] Assignee: RCA Licensing Corporation, Princeton, N.J.

[21] Appl. No.: 46,355

[22] Filed: May 6, 1987

[51] Int. Cl.⁴ .............................................. H04N 5/52
[52] U.S. Cl. ................................... 358/174; 358/179; 455/246
[58] Field of Search ....................... 358/174, 179, 175; 455/240–249

[56] References Cited

U.S. PATENT DOCUMENTS

| | | | |
|---|---|---|---|
| 3,495,031 | 2/1970 | Poppa | 358/174 |
| 3,838,210 | 9/1974 | Peil | 358/179 |
| 4,237,490 | 12/1980 | Harford | 358/174 |
| 4,630,117 | 12/1986 | Parker | 358/174 |

Primary Examiner—Howard W. Britton
Assistant Examiner—Victor R. Kostak
Attorney, Agent, or Firm—Paul J. Rasmussen; Peter M. Emanuel; Ronald H. Kurdyla

[57] ABSTRACT

In an automatic gain control (AGC) network in a video signal processing system, a comparator responds to an input control signal for providing an output control signal to an RF tuner amplifier for decreasing its gain below a normal maximum level when the input signal exceeds a threshold value. The operation of the comparator is inhibited beyond a predetermined level of the input control signal, to prevent a false output gain control signal from being developed.

5 Claims, 2 Drawing Sheets

AUTOMATIC GAIN CONTROL DELAY CIRCUIT FOR A VIDEO SIGNAL PROCESSOR

This invention concerns an automatic gain control (AGC) system for a video signal processor such as a television receiver.

Signal receivers are generally provided with an automatic gain control (AGC) system for maintaining the level of the signal applied to a detector stage of the receiver substantially constant over a relatively wide range of variations in the level of the received signal. In a television receiver, for example, the AGC system generates an AGC voltage for reducing the gain of the radio frequency (RF) and intermediate frequency (IF) amplifiers as the magnitude of the received signal increases. To obtain the best signal-to-noise ratio for a given receiver, the RF amplifier operates at full gain for a range of received signals of low level while the gain of the IF amplifier is reduced. Then the signal level increases sufficiently, the gain of the RF amplifier is reduced. The transition point at which the RF amplifier begins to exhibit less than full gain is sometimes referred to as the RF AGC delay point. The transition from maximum RF gain for small signals above the delay point, to reduced RF gain for signals below the delay point, or vice-versa, is controlled by an AGC delay circuit. The AGC delay circuit may assume many forms and usually includes a threshold comparator responsive to an IF AGC voltage applied to the IF amplifier. The threshold of the comparator corresponds to the RF AGC delay point. An output signal from the comparator is coupled to the RF amplifier for producing maximum RF gain when the IF AGC voltage indicates the presence of a range of weak signals, and for producing reduced RF gain when the IF AGC voltage indicates the presence of stronger signals.

It is herein recognized that under certain circumstances the RF amplifier may be caused to improperly exhibit a high gain condition in the presence of large receive signals. This condition has been observed to occur in response to a comparator input IF AGC voltage with a magnitude sufficient to cause the RF/IF AGC system to "latch-up", wherein the RF amplifier is caused to improperly exhibit high gain in the presence of a strong signal when less gain is required. This condition can occur when changing from a weak signal channel to a strong signal channel, for example. Such high RF gain in the presence of large signals results in RF amplifier overload with attendant visible picture "beats" due to intermodulation products, and should be avoided.

The described unwanted latching condition can be avoided by preventing large signals from entering the IF system by means of an input signal limiter. However, this approach is undesirable because of nonlinearities introduced by limiter action. In a disclosed embodiment in accordance with the principles of the present invention, the unwanted latching condition is prevented by clamping the signal IF AGC input of the RF AGC delay comparator so as to inhibit its operation beyond a predetermined level of the input signal, to prevent a false output gain control signal from being developed.

Figure 2:
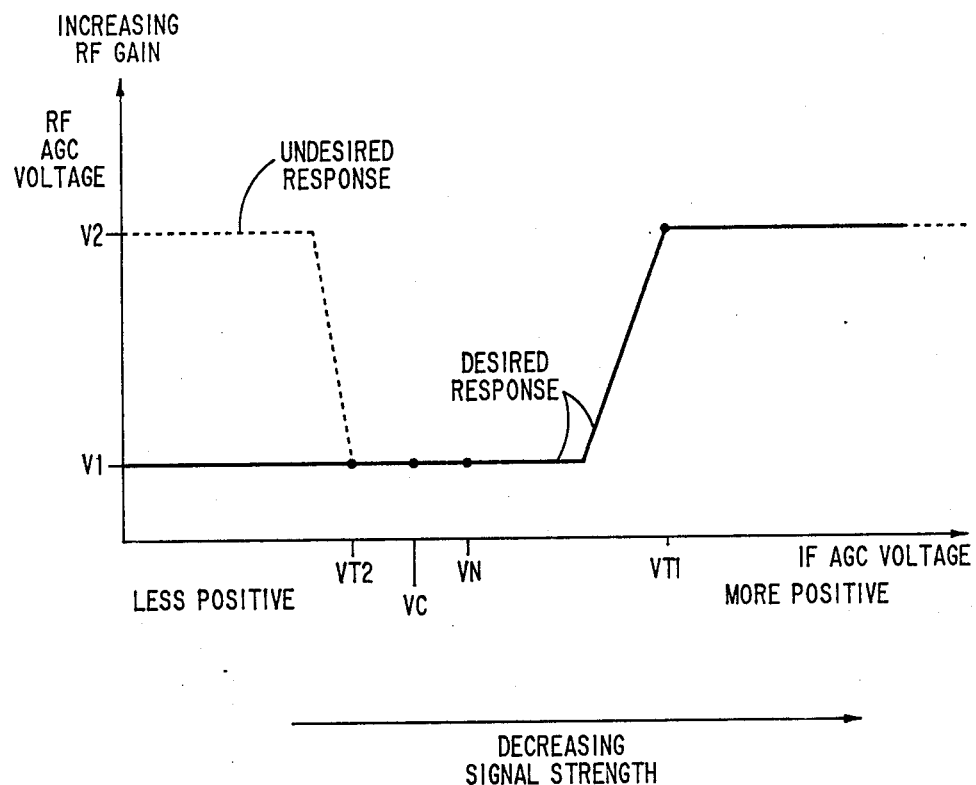

In the drawing:

FIG. 1 shows a portion of a television receiver including an AGC circuit in accordance with the principles of the present invention; and FIG. 2 illustrates a gain control characteristic helpful in understanding the operation of the circuit in FIG. 1.

In FIG. 1, a tuner 22 including a gain controllable RF amplifier 23 receives an RF television signal from a source 20 and selectively translates the RF signal of a selected TV channel to an intermediate frequency (IF) signal including video and sound carriers at 45.75 MHz and 41.25 MHz, respectively, in accordance with NTSC standards in the United States, for example. The IF signal includes an amplitude modulated (AM) video carrier of th vestigial sideband type representing the composite video information, and a frequency modulated (FM) sound carrier containing the sound information.

The IF output signal from tuner 22 is coupled to inputs of a dual channel IF surface acoustic wave (SAW) filter 24 such as the T1802 SAW filter available from Toshiba Corporation. The IF signal from tuner 22 is split into two separate channels for sound and video information demodulation in accordance with the quasi-parallel principle via the dual channels of SAW filter 24, each channel exhibiting a bandpass response around the respective carriers. A first differential output 24a of SAW filter 24 associated with the video channel is coupled to signal input terminals 4 and 5 of a network 25 which may be an integrated circuit. The video channel portion of SAW filter 24 associated with output 24a exhibits a response which matches the vestigial sideband video component of the IF signal and which attenuates the 41.25 MHz sound carrier signal. The sound channel portion of SAW filter 24 associated with a differential output 24b is coupled to sound IF signal processing circuits of known configuration (not shown).

In the video IF channel, the video component of the IF signal at input terminals 4 and 5 is coupled to an IF amplifier stage 50 which includes plural gain controllable IF amplifiers. An amplified video component from stage 50 is AC coupled to a limiter 52 and to a video detector 54 (e.g., a four quadrant multiplier). A bandpass filter tank circuit 59 coupled via terminals 6 and 7 to an output of limiter 52 is tuned to the video carrier frequency of 45.75 MHz. Limiter 52, filter 59 and video detector 54 form a synchronous video detector for producing a baseband composite video signal at the output of detector 54. The composite detected video signal is coupled via an amplifier 55 to a noise inverter 56 which in this case inverts black-going noise pulses below a given threshold level to prevent the noise pulses from disrupting the operation of subsequent sync separator circuits, and to prevent the noise pulses from interfering with automatic gain control (AGC) action.

The baseband video signal output of noise inverter 56 is coupled via a terminal 8 to a video signal processor 60 including, e.g., sync separator, luminance and chrominance frequency selection, and luminance and chrominance processing circuits for developing R, G, B color image representative signals as known. The baseband video output signal from noise inverter 56 is also coupled to an AGC detector 62 which peak detects the horizontal sync component of the baseband video signal to develop an AGC control voltage related to the magnitude of the sync component. The AGC control voltage, as developed across an AGC filter capacitor 64 coupled to a terminal 9 of circuit 25, has a magnitude related to the magnitude of the detected video signal. The AGC voltage is also coupled via a current determining resistor 65 to an AGC filter network including a resistor 68 and a storage capacitor 69 connected to terminal 1 of circuit 25. An AGC control voltage appearing at terminal 1 is coupled via an AGC amplifier 66 to a gain control input of IF amplifier stage 50 for controlling the gain of the amplifiers within stage 50 in accordance with the level of the detected video signal sync pulse to maintain a desired signal gain for the video IF channel. As will be discussed in detail subsequently, the AGC voltage at terminal 1 is also applied to an RF AGC delay circuit including a comparator 70, which provides an AGC signal to a gain control input of RF amplifier 23 in tuner 22. Comparator 70 responds to a reference voltage from a potentiometer 74 and to the IF AGC voltage from terminal 1 for providing an output gain control signal which determines the signal gain of RF amplifier 23. Potentiometer 74 establishes the operating threshold of comparator 70 to determine the AGC delay point at which comparator 70 operates to convey gain control information to RF amplifier 23 for varying its gain.

Comparator 70 includes PNP transistors 80 and 81 arranged as a differential comparator with an associated current source transistor 82. A base input of transistor 81 receives a threshold conduction reference voltage from potentiometer 74, and a base input of transistor 80 receives the IF AGC signal from terminal 1 via an emitter follower transistor 84. A collector output of comparator transistor 80 provides a gain control signal to the gain control input of the RF amplifier 23 via an inverter amplifier 85 and terminal 3. Amplifier 85 is a transresistance amplifier which provides an output voltage in response to a current input, such as a differential amplifier with a virtual ground input. Transistor 80 is normally nonconductive in response to a large positive AGC voltage, representative of small received signals, at the base of transistor 80. Amplifier 23 exhibits full gain in response to small received signals, and exhibits reduced gain in response to the conduction of transistor 80. Transistor 80 begins to conduct as the AGC voltage at the base of transistor 80 becomes increasingly less positive in the presence of large received signals, whereby the AGC signal applied to RF amplifier 23 varies so as to decrease the signal gain of amplifier 23. The following discussion of the operation of circuit 70 is made with regard to the AGC characteristic shown in FIG. 2.

FIG. 2 illustrates a desired RF AGC voltage versus IF AGC voltage response for varying signal strengths, as indicated by the solid line response. In this example, the IF AGC voltage from AGC detector 62 increases (becomes more positive) with decreasing signal strength. AGC action usually occurs above an AGC voltage VN. AGC voltages below voltage VN are associated with very large signals applied to IF amplifier 50, which occur only under certain conditions to be described. Thus the RF AGC voltage is at a relatively low level V1 for producing minimum RF gain above a prescribed signal level as the IF AGC voltage becomes less positive in response to very strong received signal levels.

Transistor 80 is conductive when the IF AGC voltage is less than a threshold level VT1. At this time amplifier 23 exhibits reduced gain. The conduction of transistor 80 ceases above threshold VT1 and the gain of amplifier 23 is at maximum (full gain) as the IF AGC signal input to comparator transistor 80 becomes increasingly more positive in response to smaller received signals. For this condition system gain is a combination of a fixed maximum RF gain and variable IF gain in response to the variable IF AGC voltage.

The portion of the response indicated by a dashed line is undesired and is associated with a system fault condition. This response causes an unwanted increase in the RF AGC voltage and RF gain under strong signal conditions, thereby causing overload of RF amplifier 23. Once this occurs, the fault condition is self sustaining, as seen from the following example.

The RF amplifier 23 will exhibit maximum gain when the receiver is tuned to a weak signal station. If the receiver is then tuned to a strong signal station, RF amplifier 23 will remain in a maximum gain condition for a period of time due to the long tuner AGC time constant, which can be as long as 2 seconds. The combination of strong received signal with the maximum gain of RF amplifier 23 results in the input signal to IF amplifier 50 having an unusually large magnitude. Such a large signal causes the IF AGC voltage to fall below (become less positive than) threshold voltage VT2, which can lead to increased conduction and saturation of comparator transistor 80. Saturation of transistor 80 causes the gain of RF amplifier 23 to improperly increase to maximum under strong signal conditions, whereby the fault condition is self-sustaining. More specifically, a collector current "I" of transistor 80 is substantially zero when transistor 80 is nonconductive, whereby amplifier 23 exhibits full gain. The gain of amplifier 23 decreases in response to an increase in the level of current I as transistor 80 conducts. Saturation of transistor 80 causes current I to become substantially zero or even to reverse direction in response to a sufficiently negative-going base voltage of transistor 80, whereby RF amplifier 23 undesirably exhibits increased gain.

The system fault condition and the associated unwanted RF AGC response are prevented by means of a clamp circuit which inhibits the operation of comparator 70 beyond a predetermined level of the input IF AGC signal to prevent the aforementioned undesired false RF AGC signal from being developed. The clamp circuit includes a normally nonconductive clamping transistor 90 with an emitter coupled to the signal input of comparator 70 at the base input of transistor 80. A voltage divider including resistors 91 and 92 provides base bias for transistor 90. Transistor 90 is biased to conduct when the input IF AGC voltage is less than voltage VN but greater than voltage VT2, thereby clamping the base input of transistor 80 to a voltage VC to prevent transistor 80 from conducting. Accordingly, the latching condition of the system and the undesired high gain condition of amplifier 23 in the presence of very large signals are prevented.

Apparatus in accordance with the principles of the present invention is useful in conjunction with video signal processing systems other than a television receiver, such as a video cassette recorder.

What is claimed is:

1. In a system for processing a video signal, automatic gain control (AGC) apparatus comprising:
a variable gain ratio frequency (RF) amplifier having a gain control input and an RF signal input;
a source of signal representative of the magnitude of a video signal to be processed by said system;
threshold control means responsive to said representative signal for selectively providing a gain control signal to said gain control input of said amplifier for controlling the signal gain of said amplifier when the magnitude of said representative signal exceeds a given threshold conduction value of said control means; and means coupled to said threshold control means for preventing said control means from responding to said representative signal beyond a predetermined magnitude of said representative signal, to prevent said threshold control means from developing a false output gain control signal.

2. Apparatus according to claim 1, wherein said representative signal is an intermediate frequency AGC signal.

3. In a system for processing a broadcast type video signal, automatic gain control (AGC) apparatus comprising:

a radio frequency (RF) tuner including a variable gain amplifier having a gain control input and an RF signal input, said amplifier normally processing small RF signals with full gain and subject to processing large RF signals with less than full gain;

a source of signal representative of the magnitude of a video signal to be processed by said system;

a comparator having a threshold conduction level and having an input for receiving said representative signal, for providing a gain control signal to said gain control input of said amplifier for causing said amplifier to exhibit said less than full signal gain when the magnitude of said representative signal exceeds said threshold level in the presence of said large RF signals; and means coupled to said comparator for preventing said comparator from responding to said representative signal beyond a predetermined mangitude of said representative signal in the presence of said large RF signals, to prevent the development of said full gain in the presence of said large RF signals.

4. Apparatus according to claim 3, wherein said inhibiting means comprises a signal clamping circuit coupled to said comparator input.

5. Apparatus according to claim 3, wherein said representative signal is an intermediate frequency AGC signal.

* * * * *